(12) United States Patent
Lu et al.

(10) Patent No.: US 12,009,050 B2
(45) Date of Patent: Jun. 11, 2024

(54) SELECTIVE ACCESS FOR GROUPED MEMORY DIES

(71) Applicant: Micron Technology, Inc., Boise, ID (US)

(72) Inventors: Yang Lu, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 138 days.

(21) Appl. No.: 17/875,960

(22) Filed: Jul. 28, 2022

(65) Prior Publication Data

US 2023/0038894 A1 Feb. 9, 2023

Related U.S. Application Data

(60) Provisional application No. 63/226,881, filed on Jul. 29, 2021.

(51) Int. Cl.
*G11C 7/00* (2006.01)
*G11C 7/10* (2006.01)
*G11C 29/46* (2006.01)

(52) U.S. Cl.
CPC .......... *G11C 7/1063* (2013.01); *G11C 7/1066* (2013.01); *G11C 7/1096* (2013.01); *G11C 29/46* (2013.01)

(58) Field of Classification Search
CPC .............. G11C 2207/105; G11C 29/26; G11C 29/4401; G11C 29/46; G11C 5/06; G11C 7/1063; G11C 7/1066; G11C 7/1096; G11C 8/12; G11C 11/4074; G11C 11/5635; G11C 11/5642; G11C 16/0483; G11C 16/10; G11C 16/16; G11C 16/26; G11C 16/30; G11C 5/145
See application file for complete search history.

(56) References Cited

U.S. PATENT DOCUMENTS 11,474,590 B2 * 10/2022 Ware ................... G06F 1/3278
2015/0161072 A1 6/2015 Gillingham
(Continued)

FOREIGN PATENT DOCUMENTS

KR 10-2020-0053754 A 5/2020

OTHER PUBLICATIONS

"International Search Report and Written Opinion of the International Searching Authority," issued in connection with Int'l Appl. No. PCT/US2022/073994 dated Nov. 1, 2022 (10 pages).

*Primary Examiner* — Thong Q Le
(74) *Attorney, Agent, or Firm* — Holland & Hart LLP

(57) ABSTRACT

Methods, systems, and devices for selective access for grouped memory dies are described. A memory device may be configured with a select die access protocol for a group of memory dies that share a same channel. The protocol may be enabled by one or more commands from the host device, which may be communicated to each of the memory dies of the group via the channel. The command(s) may indicate a first set of one or more memory dies of the group for which a set of commands may be enabled and may also indicate a second set of one or more memory dies of the group for which at least a subset of the set of commands is disabled. When the select die access mode is enabled, the disabled memory dies may be restricted from performing the subset of commands received via the channel.

41 Claims, 10 Drawing Sheets

(56) References Cited

U.S. PATENT DOCUMENTS

| | | |
|---|---|---|
| 2018/0254079 A1 | 9/2018 | Cox et al. |
| 2018/0285013 A1 | 10/2018 | Rajan et al. |
| 2020/0151053 A1 | 5/2020 | Cha et al. |
| 2021/0173773 A1 | 6/2021 | Pearson et al. |

* cited by examiner

| | OP[5] | OP[4] | OP[2] |
|---|---|---|---|
| | Byte Indicator | Link Indicator | Select Indicator |
| MR0 | 0: Lower byte | 0: IF die | 0: Masked |
| | 1: Upper byte | 1: Linked Die | 1: Enabled (Default) |
| | 00: Lower Byte, Die 0 | | N/A |
| | 01: Lower Byte, Die 1 | | |
| | 10: Upper Byte, Die 0 | | |
| | 11: Upper Byte, Die 1 | | |

605-a

| | OP[2] | OP[1] | OP[0] |
|---|---|---|---|
| | Select Die Access Level | | Mode |
| MR21 | 00: Level 0 | | 0: Disable (Default) |
| | 01: Level 1 | | 1: Enable |
| | 10: Reserved | | N/A |
| | 11: Reserved | | |

SELECTIVE ACCESS FOR GROUPED MEMORY DIES

CROSS REFERENCE

The present application for patent claims the benefit of U.S. Provisional Patent Application No. 63/226,881 by Lu et al., entitled "SELECTIVE ACCESS FOR GROUPED MEMORY DIES," filed Jul. 29, 2021, assigned to the assignee hereof, and expressly incorporated by reference herein.

FIELD OF TECHNOLOGY

The following relates generally to one or more systems for memory and more specifically to selective access for grouped memory dies.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

BRIEF DESCRIPTION OF THE DRAWINGS

FIG. 6 illustrates an example of a register configuration that supports selective access for grouped memory dies in accordance with examples as disclosed herein.

DETAILED DESCRIPTION

A memory device may include a set of multiple memory dies that may be grouped together for command and control operations and for data access operations. Each memory die in a group may be coupled with a same command/address (CA) channel and may each be operable by a same command transmitted via the CA channel. For example, if the CA channel conveys a register write command, each of the memory dies of the group may respond by performing a register write operation (e.g., as indicated by the register write command). Some commands, however, may be specific to one memory die of the group, but each memory die of the group may perform the die-specific command, for example, because the memory dies share the CA channel.

In order to support access at a memory die of the group, or a subset of memory dies of the group, the present disclosure provides techniques for performing one or more operations at a single memory die or subset of memory dies (e.g., two or three memory dies out of a group of four memory dies), based on a command received via the shared CA channel. For example, the memory device may be configured with a select die access protocol, which may be implemented by the memory device, and a host device, to perform an access operation at one or more selected memory dies of the group. The select die access protocol (e.g., or mode) may be enabled by one or more commands from the host device, which may be communicated to each of the memory dies of the group via the CA channel. The select die access command(s) may indicate a first set of one or more memory dies of the group for which a set of commands may be enabled (e.g., all commands may be enabled). The select die access command may also indicate a second set of one or more memory dies of the group for which at least a subset of the set of commands is disabled (e.g., masked or ignored).

In response to the select die access mode being enabled (e.g., based on receiving the corresponding command), the enabled or selected memory dies may react to any of the subset of commands received via the common or shared CA channel. Any non-selected or disabled memory dies may ignore any command included in the subset of commands. In some cases, different levels may exist for the select die access mode, for example, where each level may correspond to different commands being included within the ignored or masked subset of commands.

Features of the disclosure are initially described in the context of systems and dies as described with reference to FIGS. 1 and 2. Features of the disclosure are described in the context of a memory die configuration, commands, a process flow, and a register configuration as described with reference to FIGS. 3-6. These and other features of the disclosure are further illustrated by and described with reference to apparatus diagrams and flowcharts that relate to selective access for grouped memory dies as described with reference to FIGS. 7-10.

Figure 1:
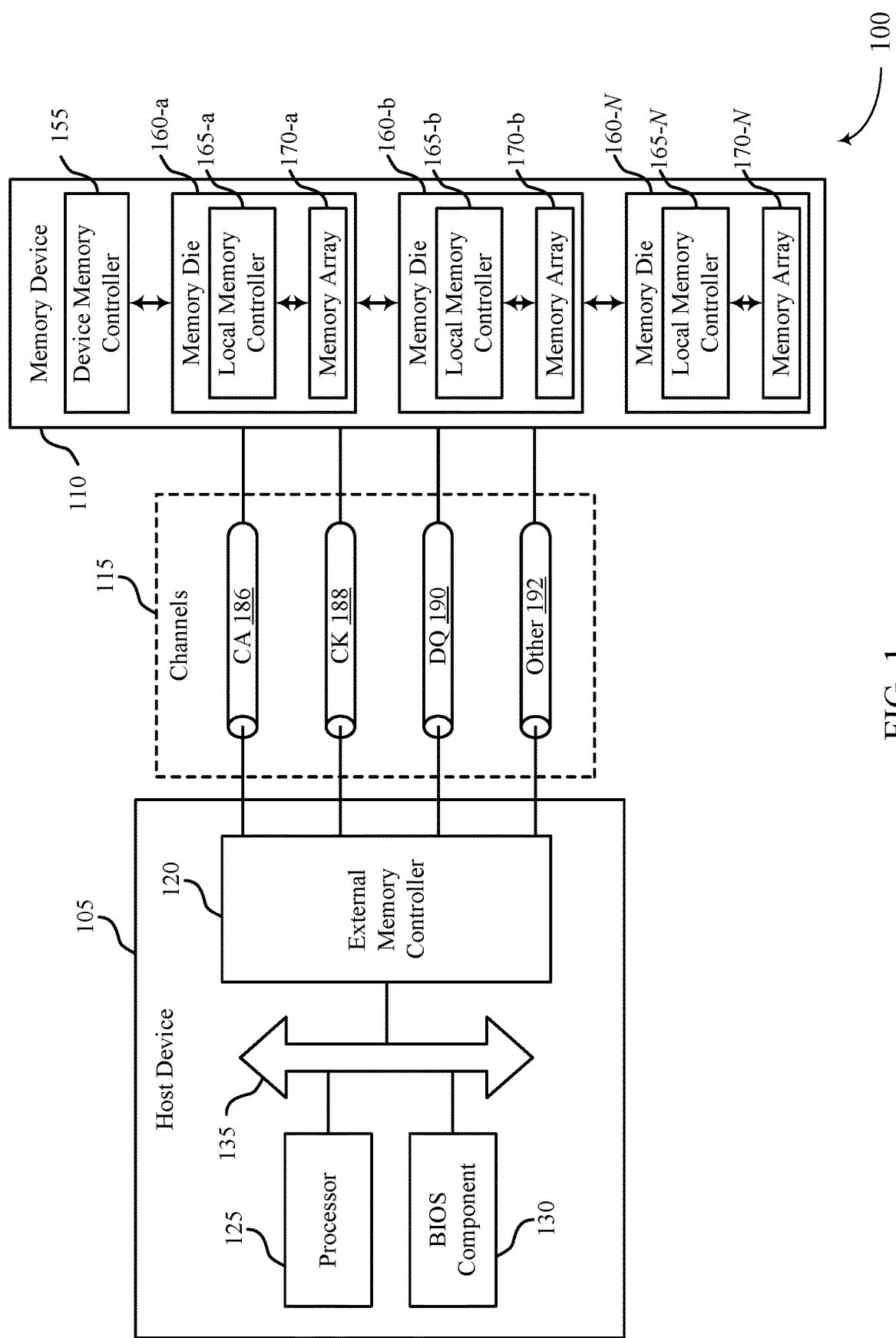
FIG. 1 illustrates an example of a system that supports selective access for grouped memory dies in accordance with examples as disclosed herein.

FIG. 1 illustrates an example of a system 100 that supports selective access for grouped memory dies in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110). In some cases, the system 100 may be referred to as a memory device or memory devices.

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. In some examples, the one or more channels may be referred to as a physical host interface. The host device 105 and the memory device 110 may, in some cases, be configured to communicate via a physical host interface using an associated protocol (e.g., to exchange or otherwise communicate control, address, data, and other signals between the memory device 110 and the host device 105). Examples of a physical host interface may include, but are not limited to, a serial AT attachment (SATA) interface, a universal flash storage (UFS) interface, an eMMC interface, a PCIe interface, a universal serial bus (USB) interface, a Fiber Channel interface, a Small Computer System Interface (SCSI), a Serial Attached SCSI (SAS), a Double Data Rate (DDR) interface, a dual-inline memory module (DIMM) interface (e.g., DIMM socket interface that supports DDR), an Open NAND Flash Interface (ONFI), a Low Power Double Data Rate (LPDDR) interface, and a Compute Express Link (CXL) interface.

If a host device 105 transmits access commands to the memory device 110, the commands may be received via the interface, e.g., according to a protocol (e.g., a UFS protocol, an eMMC protocol, a CXL protocol). Thus, the interface may be considered a front end of the memory device 110. Upon receipt of each access command, the interface may communicate the command to the memory device controller 155 or 165, e.g., via the channels 115. In some cases, each command may be added to a command queue by the interface to communicate the command to the memory device 110.

In some examples, one or more such interfaces may be included in or otherwise supported between a controller 120 of the host device 105 and a controller 155 or 165 of the memory device 110. In some examples, the host device 105 may be coupled with the memory device 110 (e.g., the host device 105 may be coupled with the memory device 110) via a respective physical host interface for each memory die 160 included in the memory device 110, or via a respective physical host interface for each type of memory die 160 included in the memory device 110.

The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more CA channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be x4 (e.g., including four signal paths), x8 (e.g., including eight signal paths), x16 (including sixteen signal paths), etc.

In some cases, the memory device 110 may be an example of a CXL device, and the memory device controller 155 or 165 may be an example of a processing unit that is configured to access one or more of the associated memory dies 160. For example, the memory device controller 155 or 165 may be configured to access the memory die(s) 160 according to a host bias mode or a device bias mode. In response to operating according to a device bias mode, the memory die(s) may be accessed (e.g., upon receiving an access request or access command) independent of the host device 105. Conversely, in response to operating according to a host bias mode, the memory device controller 165 or 155 may access the memory die(s) 160 via the host device 105. In addition, in response to one or more pages being associated with host bias mode, the host may modify the version of the one or more pages maintained by the host without notifying the memory device.

The memory device 110 may include multiple memory dies 160 that may be grouped together for command and control, as well as data access, operations. For example, each memory die 160 in a group may be coupled with a same CA channel 186 and may each be operable by a same command transmitted via the CA channel 186. In order to support access at a single memory die 160 of the group, or a subset of memory dies 160 of the group, the memory device 110 may be configured with a select die access protocol, which may be implemented by the memory device 110, and the host device 105, to perform an access operation at one or more selected memory dies 160 of the group.

The select die access protocol (e.g., or mode) may be enabled by one or more commands from the host device 105, which may be communicated to each of the memory dies 160 of the group via the CA channel 186. The select die access command(s) may indicate a first set of one or more memory dies 160 of the group for which a set of commands may be enabled (e.g., all commands may be enabled). The select die access command may also indicate a second set of one or more memory dies 160 of the group for which at least a subset of the set of commands is disabled (e.g., masked or ignored). In response to the select die access mode being enabled (e.g., based on receiving the corresponding command), the enabled or selected memory dies 160 may react to any of the subset of commands received via the common or shared CA channel. Any non-selected or disabled memory dies 160 may ignore any command included in the subset of commands.

Figure 2:
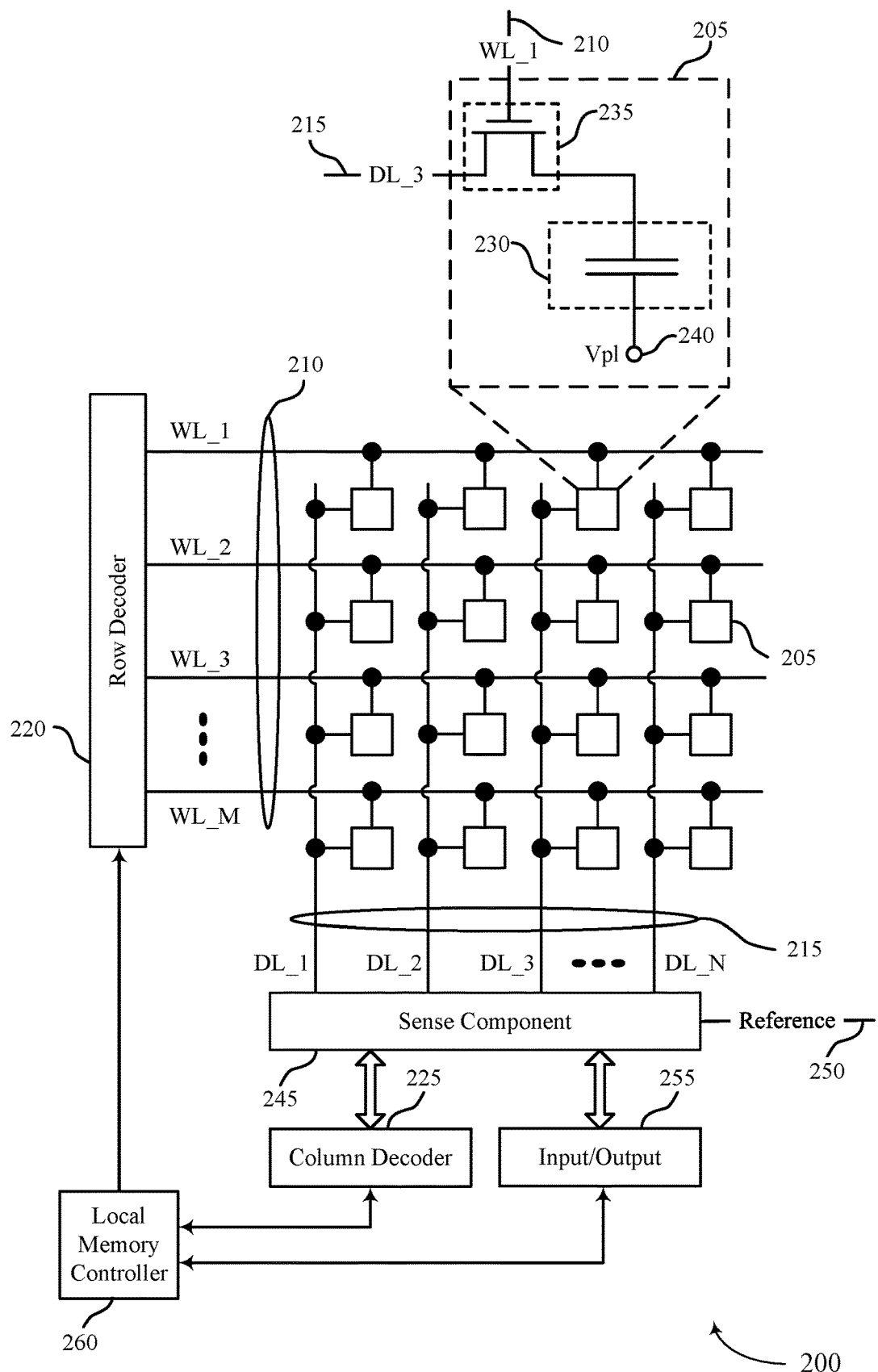
FIG. 2 illustrates an example of a memory die that supports selective access for grouped memory dies in accordance with examples as disclosed herein.

FIG. 2 illustrates an example of a memory die 200 that supports selective access for grouped memory dies in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 in response to the switching component 235 being deactivated, and the capacitor 230 may be coupled with digit line 215 in response to the switching component 235 being activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

The memory die 200 may be included in a set of multiple memory dies grouped together for command, control and data operations. For example, each memory die in a group (e.g., including the memory die 200) may be coupled with a same CA channel and may each be operable by a same command transmitted via the CA channel. In order to support access at a single memory die of the group (e.g., such as the memory die 200), or a subset of memory dies of the group (e.g., including the memory die 200), the group of memory dies may perform a select access protocol to carry out an access operation at one or more selected memory dies of the group.

The select die access protocol (e.g., or mode) may be enabled by one or more commands from a host device, which may be communicated to each of the memory dies of the group via the shared CA channel. The select die access command(s) may indicate a first set of one or more memory dies of the group (e.g., including the memory die 200) for which a set of commands may be enabled (e.g., all commands may be enabled). The select die access command may also indicate a second set of one or more memory dies of the group for which at least a subset of the set of commands is disabled (e.g., masked or ignored). In response to the select die access mode being enabled (e.g., based on receiving the corresponding command), the enabled or selected memory dies (e.g., including the memory die 200) may react to any of the subset of commands received via the common or shared CA channel. Any non-selected or disabled memory dies may ignore any command included in the subset of commands.

Figure 3:
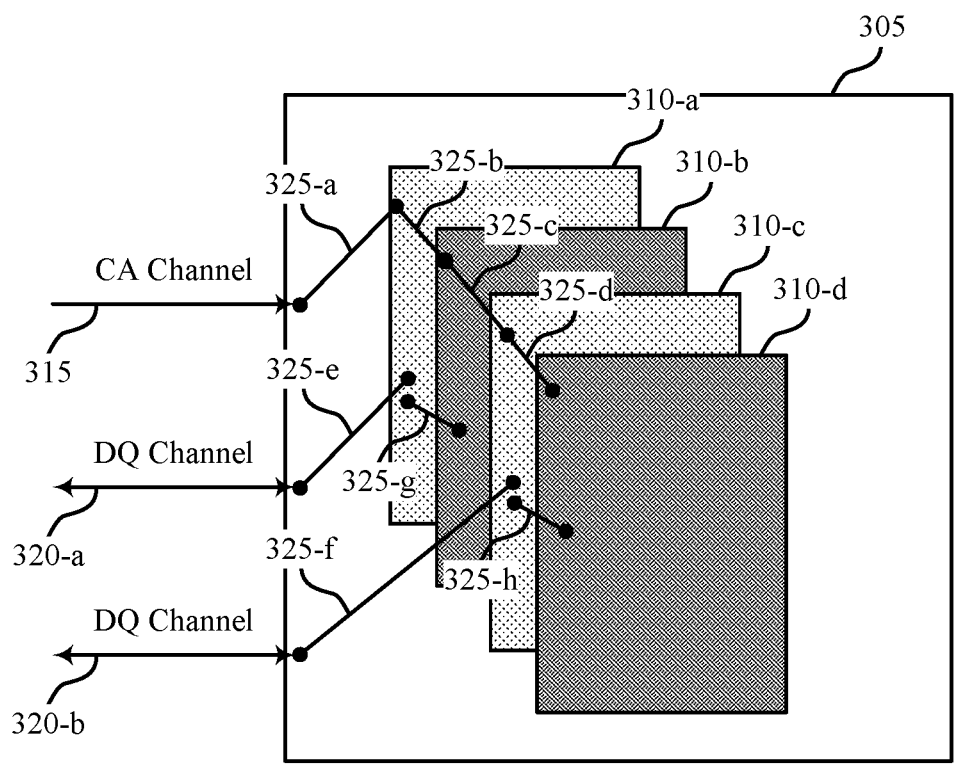
FIG. 3 illustrates an example of a memory die configuration that supports selective access for grouped memory dies in accordance with examples as disclosed herein.

FIG. 3 illustrates an example of a memory die configuration 300 that supports selective access for grouped memory dies in accordance with examples as disclosed herein. Memory die configuration 300 may represent a part or a portion of a memory device described herein with reference to FIGS. 1 and 2. For example, the memory die configuration 300 may include a group 305 of memory dies 310, where each of the memory dies 310 may represent a respective memory die as described with reference to FIGS. 1 and 2. The group 305 of memory dies may include a quantity of memory dies 310 (e.g., four memory dies 310) that may share a same CA channel 315 (e.g., may each be coupled with the same CA channel 315). The CA channel 315 may represent a CA channel, a CK channel, or both, as described with reference to FIG. 1. Additionally or alternatively, the CA channel 315 may represent a chip select (CS) channel, which may be used to select one or more memory chips of the memory device (e.g., in addition to being used as a CA channel, a CK channel, or both).

As illustrated by FIG. 3, each memory die 310 may be coupled with the CA channel 315, such as via one or more electrical connections, traces, or electrodes (e.g., among other examples). In some cases, each memory die 310 may be coupled directly with the CA channel 315, while in some other cases each memory die 310 may be coupled with the CA channel 315 via another memory die 310. For example, a memory die 310-*a* may be coupled with the CA channel 315 through a connection 325-*a* (e.g., a trace or electrode), a memory die 310-*b* may be coupled with the CA channel 315 through a connection 325-*b* and connection 325-*a*, and so forth for memory dies 310-*c* and 310-*d* and connections 325-*c* and 325-*d*, respectively.

Each memory die 310 may be coupled with a respective DQ channel 320, which may be configured to communicate eight bits (e.g., one byte) of data. A first set of memory dies 310 (e.g., memory dies 310-*a* and 310-*b*) may share a first DQ channel (e.g., may both be coupled with a DQ channel 320-*a*) and a second set of memory dies 310 (e.g., memory dies 310-*c* and 310-*d*) may share a second DQ channel (e.g., may both be coupled with a DQ channel 320-*b*). Each memory die 310 may be coupled with the respective DQ channel 320 via one or more electrical connections, traces, or electrodes (e.g., among other examples). In some cases, each memory die 310 may be coupled directly with the respective DQ channel 320, while in some other cases each memory die 310 may be coupled with the respective DQ channel 320 via another memory die 310.

For example, memory die 310-*a* may be coupled with DQ channel 320-*a* through a connection 325-*e* and memory die 310-*b* may be coupled with DQ channel 320-*a* through a connection 325-*g* and connection 325-*e*. Similarly, memory die 310-*c* may be coupled with DQ channel 320-*b* through a connection 325-*f* and memory die 310-*d* may be coupled with DQ channel 320-*b* through a connection 325-*h* and connection 325-*f*.

The grouped memory dies 310 may be referred to as being one group 305 per rank per channel, for example, based on each memory die 310 in the group 305 being coupled with (e.g., and operable by) the same CA channel 315 (e.g., CA channel, CK channel, CS channel, or any combination). Because the memory dies 310 share a same CA channel 315, the memory dies 310 may receive a same command (e.g., at the same time) via the CA channel 315 and may each be operable by the received command.

In some cases, the memory die configuration 300 may be a part of, or represent an example of, a CXL configuration for the memory device. For example, an interface for the group 305 of memory dies, for example, as represented by the CA channel 315 and the DQ channels 320-*a* and 320-*b*, may be an interface that is configured for CXL protocols. While some examples described herein are with reference to memory dies 310 configured according to one or more CXL protocols, the same examples may apply to any configuration of memory dies 310 that are coupled with a same CA channel 315.

Each of the memory dies 310 may respond to (e.g., perform) a same command received via the CA channel 315 because the memory dies 310 of the group 305 may be coupled with the same CA channel 315. For example, if the CA channel 315 conveys a register write command, each of the memory dies 310 of the group 305 may respond by performing a register write operation (e.g., as indicated by the register write command). In some cases, a command such as a repair command (e.g., for a post package repair (PPR) operation) or a trim command (e.g., a trim by die or a trim by byte operation) may be specific to one memory die 310 of the group 305. However, in such cases, each memory die 310 of the group 305 may perform the die-specific command, for example, because the memory dies 310 share the CA channel 315.

In such cases, accessing an individual memory die 310 of the group 305, or a subset of memory dies 310 of the group 305, may be restricted by the memory dies 310 being coupled with the same CA channel 315. Further, the configuration of the memory dies 310 (e.g., the memory die configuration 300) may be restricted to a standardize configuration (e.g., an LP5 interface), such that additional pins or channels may not be supported at the memory device (e.g., based on maintaining a compatibility with a memory controller or host device, based on a lack of space for extra pins or for extra signal processing at the memory device).

In order to support individual access at a memory die 310 (e.g., or a subset of memory dies 310 of the group 305), the present disclosure provides techniques for performing one or more operations at a single memory die 310 of the group 305, or a subset of memory dies 310 of the group 305 (e.g., two or three memory dies 310), based on a command received via the shared CA channel 315. For example, the memory device may be configured with a select die access protocol, which may be implemented by the memory device, and a host device, to implement an access operation at one or more selected memory dies 310 of the group 305.

The select die access protocol (e.g., or mode) may be enabled by a command (e.g., a first command) from the host device, which may be communicated to each of the memory dies 310 of the group 305 via the CA channel 315. The select die access command may be a dedicated command, or may be included as a subset of one or more existing commands (e.g., a multipurpose (MPC) command). The select die access command may indicate a first set of one or more memory dies 310 of the group 305 for which a set of commands may be enabled (e.g., all commands may be enabled). The select die access command may also indicate a second set of one or more memory dies 310 of the group 305 for which at least a subset of the set of commands is disabled (e.g., masked or ignored).

In response to the select die access mode being enabled (e.g., based on receiving the corresponding command), the enabled or selected memory dies 310 may react to any of the subset of commands received via the common or shared CA channel 315. Any non-selected or disabled memory dies 310 may ignore any of the subset of commands. In some cases, different levels may exist for the select die access mode, for example, where each level may correspond to different commands being included within the ignored or masked subset of commands.

The information regarding whether a memory die 310 is enabled or disabled for the select die access mode may be stored at a respective register of the memory device that corresponds to the memory die 310. Similarly, information regarding whether the select die access feature or mode is enabled or disabled may be stored at a register (e.g., a dedicated register) of the memory device. Additionally or alternatively, information associated with the enabling or disabling of memory dies 310, or enabling or disabling of the select die access mode, may be stored at or indicated by one or more corresponding fuses of the memory device.

In a first example of the select die access mode, the host device may transmit a command, which may enable the select die access mode for the memory device and, in some cases, may indicate a level for the select die access mode. For example, the host device may issue a register write command, which may indicate for the memory device to store information in a register indicative that the select die access mode is enabled for the memory device. The host device may further transmit a select die access command, which may enable and/or disable one or more memory dies 310 of the memory device for the select access mode, as described herein.

The memory device may enter the select die access mode based on receiving the command from the host device and may, for example, enter a first level (e.g., Level 0) of the select die access mode. For example, the memory device may perform a register read operation to determine whether the select die access mode is enabled (e.g., in response to performing the register write). In some cases, the memory device may additionally perform a register read operation (e.g., a same register read or a different register read) to determine a level of the select die access mode and to determine which memory dies 310 may be enabled and/or disabled for the select die access mode.

The host device may issue a second command, such as a second register write command, which may indicate for the enabled memory die(s) 310 to perform the second register write. In such cases, a register write command may be included in the subset of restricted or masked commands. The memory device may receive the second command and may perform the second command (e.g., perform the register write operation) for the enabled, or unmasked, memory die(s) 310. The disabled memory die(s) 310 may ignore the second command, for example, based on being disabled and based on the second command being included in the subset of masked commands. The disabled memory die(s) 310 may still receive and perform commands from the host device that are not included in the subset of masked commands. For example, the disabled memory die(s) 310 may perform one or more operations based on an activate command, a precharge command, a write command, or any combination thereof.

The host device may issue one or more other commands included in the subset of masked commands, such that the enabled memory die(s) 310 may perform operations based on the one or more other commands and the disabled memory die(s) 310 may be restricted from performing (e.g., refrain from performing) operations based on the one or more other commands. In some cases, the host device may issue a second select die access command, which may change which memory dies 310 are enabled and disabled. For example, the host device may issue a second select die access command, which may indicate that a previously enabled memory die 310 is to operate in a disabled mode and that a previously disabled memory die 310 is to operate in an enabled mode. The host device may further issue one or more commands for the newly enabled memory die(s) 310 to perform. The host device may further determine to exit the select access mode, for example, based on completing memory die-specific operations (e.g., based on determining to re-enter a default, shared-command mode). In such cases, the host device may issue a register write command, which may indicate for the memory device to store information in a register indicative that the select die access mode is disabled for the memory device.

In a second example of the select die access mode, the host device may transmit a command indicating for the memory device to enter a repair mode (e.g., a PPR mode, such as hPPR or sPPR). The memory device may enter the repair mode based on receiving the command from the host device. The host device may transmit a second command to enable the select die access mode for the memory device and, in some cases, may indicate a level for the select die access mode. For example, as described herein, the host device may issue a register write command. The memory device may enter the select die access mode based on receiving the second command from the host device and may, for example, enter a second level (e.g., Level 1) of the select die access mode based on being in the repair mode. For example, the memory device may perform a register read operation to determine whether the select die access mode is enabled and to determine enabled and/or disabled memory dies 310, as described herein.

The host device may further transmit a select die access command, which may enable and/or disable one or more memory dies 310 of the memory device for the select access mode. The host device may issue one or more third command, such as one or more repair commands, which may indicate for the enabled memory die(s) 310 to perform the repair (e.g., PPR). In such cases, the one or more repair commands may be included in the subset of restricted or masked commands. The memory device may receive the one or more third commands and may perform the command(s) (e.g., perform the repair) for the enabled, or unmasked, memory die(s) 310. The disabled memory die(s) 310 may ignore the one or more third commands, for example, based on being disabled and based on the one or more third commands being included in the subset of masked commands.

The host device may issue one or more other commands included in the subset of masked commands, such that the enabled memory die(s) 310 may perform operations based on the one or more other commands and the disabled memory die(s) 310 may be restricted from performing (e.g., refrain from performing) operations based on the one or more other commands. In some cases, the host device may issue a second select die access command, which may change which memory dies 310 are enabled and disabled. For example, the host device may issue a second select die access command, which may indicate that a previously enabled memory die 310 is to operate in a disabled mode and that a previously disabled memory die 310 is to operate in an enabled mode. The host device may further issue one or more commands for the newly enabled memory die(s) 310 to perform.

The host device may further determine to exit the select access mode, for example, based on completing memory die-specific operations (e.g., based on determining to re-enter a default, shared-command mode). In such cases, the host device may issue a register write command, which may indicate for the memory device to store information in a register indicative that the select die access mode is disabled for the memory device. After exiting the select die access mode, the host device may issue a command for the memory device to exit the repair mode. Exiting the select die access mode, followed by exiting the repair mode, may support avoidance of configuring different repair modes and select die access levels among the grouped memory dies 310.

Figure 4A:
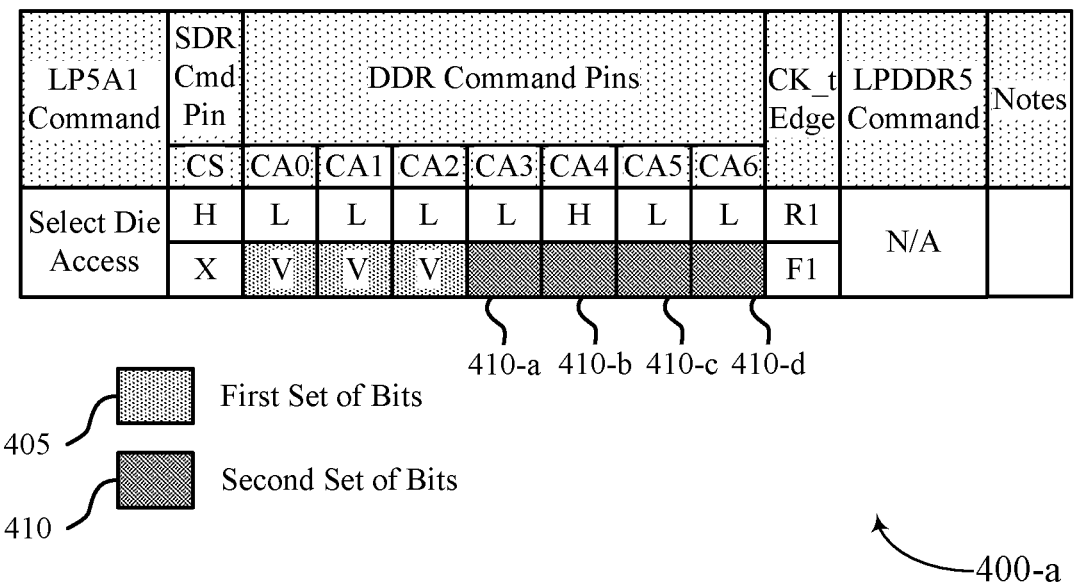
FIGS. 4A and 4B illustrate examples of commands that support selective access for grouped memory dies in accordance with examples as disclosed herein.
Figure 4B:
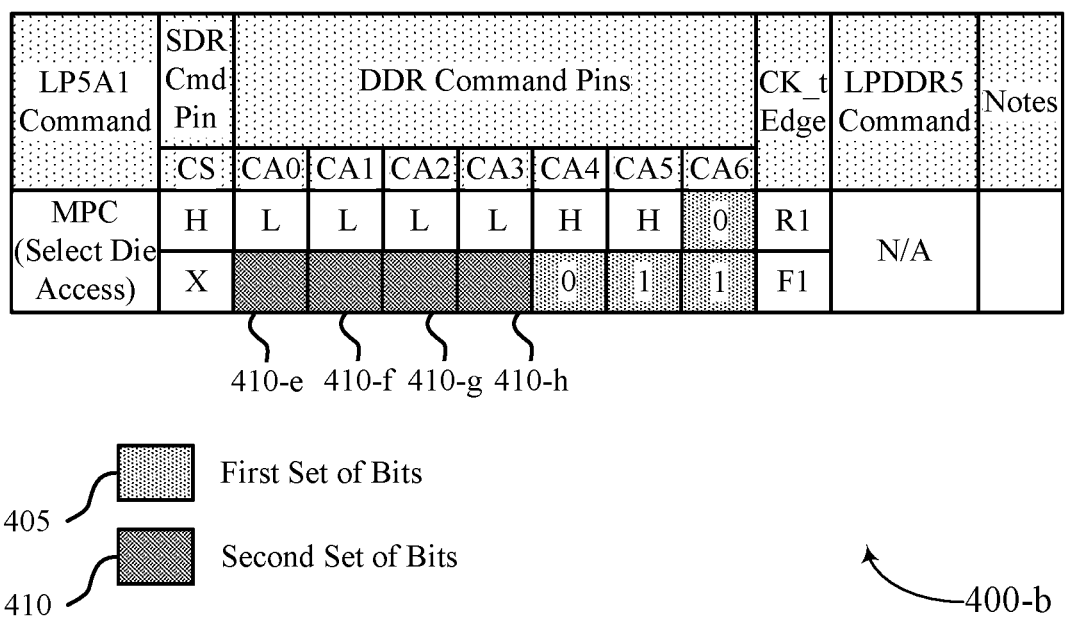

FIGS. 4A and 4B illustrate examples of commands 400-*a* and 400-*b* that support selective access for grouped memory dies in accordance with examples as disclosed herein. For example, commands 400-*a* and 400-*b* may respectively represent an example of a select die access command as described with reference to FIG. 3. A host device may issue command 400-*a* or 400-*b*, for example, to indicate one or more memory dies of a memory device (e.g., grouped memory dies) to enable and/or disable for a select die access mode. The host device, memory device, and memory dies may represent respective examples of the corresponding devices described with reference to FIGS. 1-3.

Commands 400-*a* and 400-*b* may each represent an example of a select die access command as described herein, which may identify one or more memory dies of the memory device to enable and/or disable for a select die access mode. In some cases, a select die access command may be ignored outside of the select die access mode, such that the command may be implemented in response to the select die access mode being enabled and ignored in response to the select die access mode being disabled. The command 400-*a* or 400-*b* may be transmitted from a host device to a memory device, for example, via a CA channel (e.g., a CA bus) as described with reference to FIGS. 1 and 3. The command 400 may indicate one or more bits of information, which may identify a type of the command 400 and identify information conveyed by the command 400.

Each bit may be received via a respective pin of the CA channel. For example, respective bits may be received via corresponding pins identified from CA0 to CA6 (e.g., from a first to a seventh CA pin), as well as via a CS pin. Some bits, such as those labeled 'H' or 'L' in FIGS. 4A and 4B, may represent a definition of the command 400-*a* or 400-*b*, and may, for example, represent a high or low voltage level, respectively, received via the corresponding pin. The command 400, as transmitted, may also include information identifying a type of the command. For example, bit values indicated by a first set of bits 405 may identify a type or name of the command 400 (e.g., a select die access command, an MPC command). In some examples illustrated by FIG. 4A, a defined value (e.g., values of "Ls" and "Hs") of the bits conveyed via CA0, CA1, CA2, CA3, CA4, CA5, and CA6 may indicate that the command 400-*a* is a select die access command, which may be a dedicated command for the select die access mode. In some examples illustrated by FIG. 4A, a defined value (e.g., a value "V") of the bits conveyed via CA0, CA1, and CA2 may indicate that the command 400-*a* is a select die access command, which may be a dedicated command for the select die access mode.

In some examples illustrated by FIG. 4B, a defined value (e.g., values of "Ls" and "Hs") of the bits conveyed via CA0, CA1, CA2, CA3, CA4, and CA5 may indicate that the command 400-*b* is an MPC command that is configured for select die access. In such examples, the values of '0' received via CA4, '1' received via CA5, '1' received via CA6, and a second '0' received via CA6 may indicate the specific MPC command that is being implemented (e.g., a command to enter the select die access mode). In some examples illustrated by FIG. 4B, a value of '0' received via CA4, '1' received via CA5, '1' received via CA6, and a second '0' received via CA6 may indicate that the command 400-*b* is an MPC command that is configured for select die access. In such cases, a value of '0110' for the first set of bits 405 and any values for a second set of bits 410 (e.g., values of 'XXXX') may indicate that the command 400-*b* is an MPC command for select die access mode. Alternatively, other values for the first set of bits 405 such as '1000' may indicate that the MPC command is a different type of command, with the second set of bits 410 further identifying the type of command (e.g., in combination with the first set of bits 405). While some of the examples described herein relate to an MPC command, the same example may apply to a type or class of command that may be adjusted or modified to indicate one or more features of a select die access mode.

An MPC command may represent a training command that is associated with synchronization and calibration operations for memory dies of the memory device. For example, an MPC command may be used to calibrate output drive strength and termination resistance for a reference (e.g., calibration reference) pad of the memory device. Additionally or alternatively, an MPC command may be used for starting or stopping an interval oscillator associated with clock signals or timing at the memory device.

The second set of bits 410 indicated by command 400-*a* or 400-*b* may include bits that are each respectively associated with a memory die of a group of memory dies. For example, bit 410-*a* (e.g., received via CA3) may be associated with a first memory die, bit 410-*b* (e.g., received via CA4) may be associated with a second memory die, bit 410-*c* (e.g., received via CA5) may be associated with a third memory die, and bit 410-*d* (e.g., received via CA6) may be associated with a fourth memory die. A respective value for each of the second set of bits 410 may represent whether the associated memory die is enabled or disabled for the select die access mode.

For example, a value of '1' for bit 410-*a* may indicate that the first memory die is enabled for the select die access mode, while a value of '0' may indicate that the first memory die is disabled. Similar examples may apply to the other bits 410, including bits 410-*e*, 410-*f*, 410-*g*, and 410-*h* of command 400-*b*. For example, each of bits 410-*e*, 410-*f*, 410-*g*, and 410-*h* may be associated with a respective memory die and the associated bit 410 may indicate whether the memory die is enabled or disabled.

Based on receiving a command 400-*a* or 400-*b*, the memory device may update a corresponding indicator for each memory die that is enabled and/or disabled. For example, if a first memory die is disabled, the memory device may update an indicator (e.g., in a register corresponding to the first memory die) to indicate that the first memory die is disabled for the select die access mode. Similarly, if the first memory die is enabled, the memory device may update an indicator (e.g., in a register corresponding to the first memory die) to indicate that the first memory die is enabled for the select die access mode. Updating indicators for the corresponding memory dies is further described herein with reference to FIG. 6.

Based on the received command 400-*a* or 400-*b*, the memory device may ignore commands (e.g., within a subset of commands) for one or more disabled memory dies and may perform commands for one or more enabled memory dies.

Figure 5:
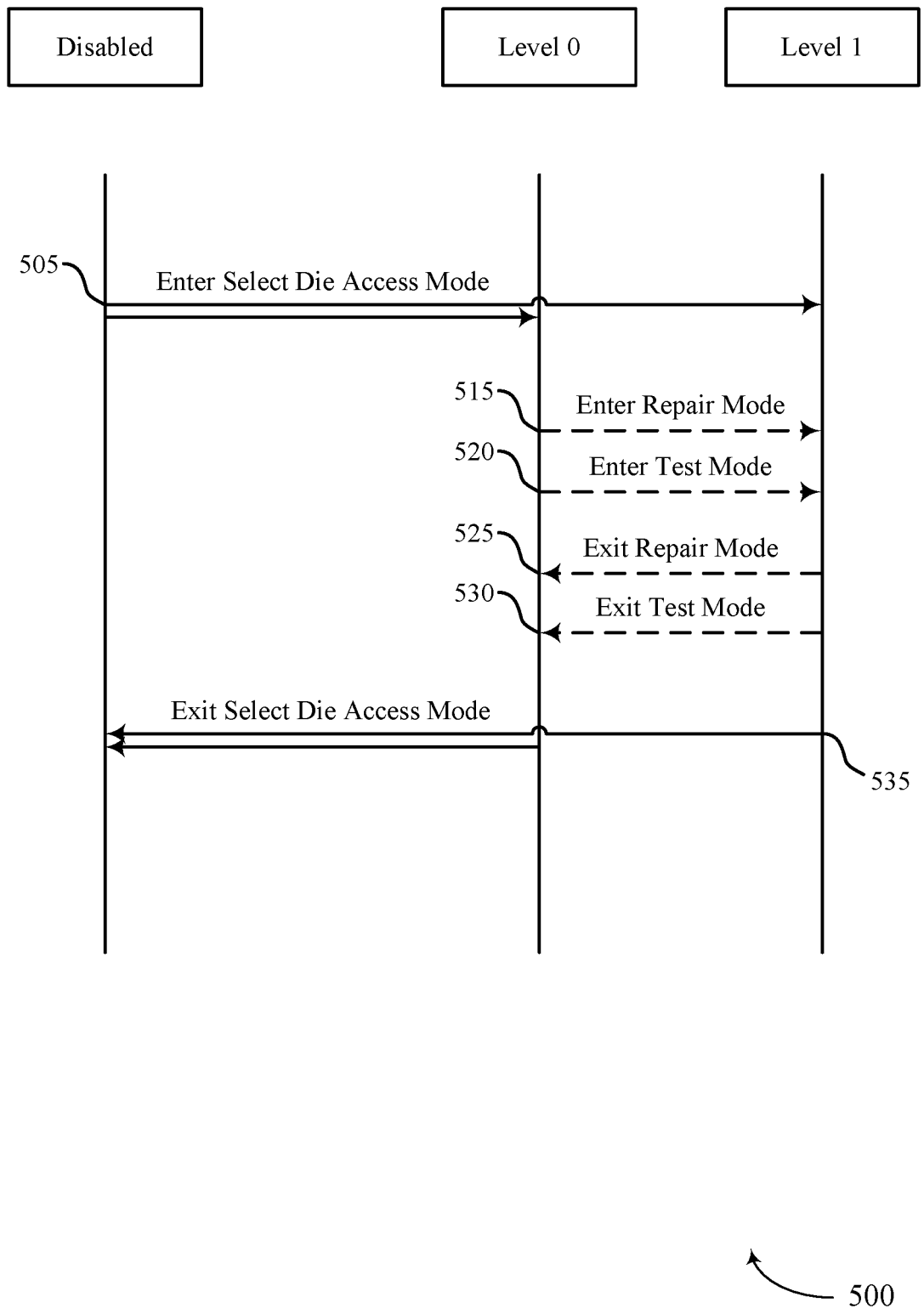
FIG. 5 illustrates an example of a process flow that supports selective access for grouped memory dies in accordance with examples as disclosed herein.

FIG. 5 illustrates an example of a process flow 500 that supports selective access for grouped memory dies in accordance with examples as disclosed herein. The process flow 500 may illustrate an example of techniques used for entering and exiting a first level (e.g., Level 0) and/or a second level (e.g., Level 1) of a select die access mode. As described herein a level of the select die access mode may additionally or alternatively be referred to as a mode of the select die access mode. Process flow 500, or aspects thereof, may be implemented by a memory device as described with reference to FIGS. 1-4. For example, process flow 500 may support one or more techniques as described herein for entering a select die access mode and, in some cases, for changing a level of the select die access mode.

In the following description of process flow 500, the operations may be performed in a different order than the order shown, or the operations performed by the memory device may be performed in different orders or at different times. For example, some operations may also be left out of process flow 500, or other operations may be added to process flow 500. As another example, operations shown as performed at a single portion of process flow 500 may in some cases be performed as multiple instances (e.g., multiple portions) over some duration of time, or multiple steps or portions may be combined into a single instance. Although the memory device is described as performing the operations of process flow 500, some aspects of some operations may also be performed by one or more other devices.

At 505, the memory device may enter the select die access mode. For example, as described with reference to FIG. 3, the memory device may receive a command (e.g., a register write command) from a host device, which may indicate for the memory device to enter the select die access mode. Based on the command, the memory device may configure one or more registers and may enter the select die access mode. The registers and the configuration thereof are further described herein with reference to FIG. 6.

In some cases, based on one or more factors, the memory device may enter the select die access mode at the first level (e.g., Level 0), or may enter the select die access mode at the second level (e.g., Level 1). For example, as described with reference to FIG. 3, the memory device may enter Level 0 for the select die access mode if no other commands or modes have been enabled or may enter Level 1 for the select die access mode if one or more commands or modes have previously been enabled by the host device (e.g., a repair mode or a test mode have been enabled). In response to the memory device entering Level 1 based on the repair mode (e.g., PPR mode) or the test mode (e.g., a test mode configured for testing one or more select die access features), the memory device may also return to Level 0 upon exiting the repair mode or the test mode (e.g., clearing the test mode).

In some cases, at 515, the memory device may enter a repair mode, for example, based on a command received from the host device (e.g., having previously entered Level 0 of the select die access mode). Based on entering the repair mode (e.g., PPR mode), the memory device may switch from Level 0 to Level 1. Based on entering Level 1, the memory device may configure one or more registers to indicate that the select die access mode is associated with Level 1, as further described with reference to FIG. 6.

At 525, in some cases, the memory device may exit the repair mode, for example, based on a command received from the host device (e.g., or based on finishing one or more repairs). Based on exiting the repair mode, the memory device may switch from Level 1 to Level 0 and may configure one or more registers to indicate that the select die access mode is associated with Level 0.

Similarly, in some cases, at 520, the memory device may enter a test mode (e.g., a select die access test mode), for example, based on a command received from the host device (e.g., having previously entered Level 0 of the select die access mode). Based on entering the test mode, the memory device may switch from Level 0 to Level 1. Based on entering Level 1, the memory device may configure one or more registers to indicate that the select die access mode is associated with Level 1, as further described with reference to FIG. 6.

At 530, in some cases, the memory device may exit the test mode, for example, based on a command received from the host device (e.g., or based on finishing one or more test procedures or operations). Based on exiting the repair mode, the memory device may switch from Level 1 to Level 0 and may configure one or more registers to indicate that the select die access mode is associated with Level 0.

While some examples herein describe changing levels of the select die access mode based on entering or exiting a repair mode or a test mode, that such examples may also apply to entering or exiting one or more other modes of operation of the memory device without departing from the scope of the present disclosure. For example, the memory device may switch from Level 0 to Level 1 based on entering another mode of operation (e.g., or based on entering a combination of modes of operation) and may switch back from Level 1 to Level 0 based on exiting the other mode of operation (e.g., or other combination of modes).

At 535, the memory device may exit the select die access mode. For example, as described with reference to FIG. 3, the memory device may receive a command (e.g., a register write command) from a host device, which may indicate for the memory device to exit the select die access mode. Based on the command, the memory device may configure one or more registers and may exit the select die access mode. The registers and the configuration thereof are further described herein with reference to FIG. 6. The memory device may exit the select die access mode from Level 0 (e.g., if the memory device is operating at Level 0 in response to the command to exit being received), or may exit the select die access mode from Level 1 (e.g., if the memory device is operating at Level 1 in response to the command to exit being received).

As described herein with respect to FIG. 3, the different levels of the select die access mode may mask or disable different subsets of commands for disabled memory die(s), while enabled memory die(s) may still perform any received commands. As such, each level may be associated with a different subset of masked commands (e.g., as given by a configuration used by the memory device and the host device). For example, Level 0 may represent a default select die access level (e.g., default select die access mode). In Level 0, the disabled memory die(s) may be limited to masking or disabling a smaller subset of commands (e.g., received via a shared CA channel), which may be differentiated between memory dies.

For example, as shown by Table 1, the subset of masked or disabled commands may include one or more register write commands, such as a mode register write (MRW) command or a TMRW command) for Level 0, such that a register write command may be performed for the enabled memory die(s) but not for the disabled memory die(s). The subset of disabled commands may further include commands associated with a DQ channel or pin (e.g., TDQ), as well as one or more other commands (e.g., AFPCmd), which may similarly be performed for the enabled memory die(s) but not for the disabled memory die(s). For unmasked commands (e.g., commands not included in the subset), each memory die may receive and perform the commands, whether or not the memory die is enabled or disabled.

Level 1, as described herein, may represent an elevated, or more strict, level of the select die access mode. For example, in Level 1 a disabled memory die may ignore more commands (e.g., a majority of the commands) received via the shared CA channel. For example, as shown by Table 1, the subset of disabled commands may include a majority of commands, but may exclude a select die access command (e.g., a dedicated select die access command or an MPC command) and a register read, such as a mode register read (MRR) command, such that these commands may still be performed by a disabled memory die (e.g., in response to being received from the host device). In cases where the select die access command represents a dedicated command, MPC commands may also be disabled or masked by a disabled memory die, while in cases where the select die access command represents an MPC command, MPC commands may remain unmasked or enabled.

TABLE 1

Enabled and Disabled Commands for Select Die Access Levels

| Command/Mode | Level 0 | Level 1 |
| --- | --- | --- |
| MPC/Select Die Access | Enabled | Enabled |
| MRW | Disabled | Disabled |
| TMRW | Disabled | Disabled |
| MRR | Enabled | Enabled |
| ACT/PRE/REF | Enabled | Disabled |
| CAS/WR/RD | Enabled | Disabled |
| AFPCmd | Disabled | Disabled |
| TDQ | Disabled | Disabled |
| Others | Enabled | Disabled |

If a disabled memory die represents a memory die that is indirectly coupled with a DQ channel (e.g., via a second memory die), the disabled memory die may still receive and respond to DQ commands if the second, linked memory die is enabled. The DQ channel (e.g., DQ bus) may also respond to read and write commands for a disabled memory die (e.g., a linked memory die) whether or not an indirectly linked memory die is enabled or disabled. Similarly, a disabled memory die may be disconnected from one or more DQs used as a timing DQ (TDQ) and a voltage reference output DQ (VRO-DQ). In cases where both memory dies for a DQ channel are enabled (e.g., the directly and indirectly linked memory dies), the indirectly linked memory die (e.g., interface die) may take over a TDQ. If a TDQ is shared with a disabled memory die (e.g., is shared between a disabled and enabled memory die using the same DQ channel), the disabled memory die may take over the TDQ. A timing command for a register write may be used in a defined mode.

While the examples described herein reference two levels or modes for the select die access mode (e.g., Level 0 and Level 1), the same examples may also apply to more than two levels for the select die access mode (e.g., three or more levels). For example, different subsets of disabled commands may be defined for each of the three or more levels, and different levels may be associated with different modes of operation for the memory device, such that entering a mode of operation may enable, or cause the memory device to enter, the corresponding level.

FIG. 6 illustrates an example of a register configuration 600 that supports selective access for grouped memory dies in accordance with examples as disclosed herein. The register configuration 600 may represent a configuration of different registers 605 at a memory device that may support a select die access mode as described herein. For example, a register 605-*a* may store or indicate information associated with a status of a corresponding memory die (e.g., an enabled or disabled status) for the select die access mode. Similarly, a register 605-*b* may store or indicate information associated with a status or mode of the select die access mode.

In some cases, the memory device may include one register 605-*a* (e.g., a mode register 0 (MR0)) for each memory die within a set of multiple of memory dies that share a same CA channel. For example, if the memory device includes four memory dies that share a same CA channel (e.g., among other memory dies), the memory device may at least include one register 605-*a* for each respective memory die of the set. Each register 605-*a* may indicate an identity of the corresponding memory die (e.g., may indicate a unique identifier (ID) of the memory die) using one or more bits stored at the register 605-*a*. For example, the register may use two bits to identify one of four memory dies, where a first bit (e.g., OP[5]) may represent a byte indicator and a second bit (e.g., OP[4]) may represent a link indicator.

The byte indicator may indicate a DQ channel to which the respective memory die is coupled, for example, because each DQ channel may be configured to convey one byte of data (e.g., as described herein with reference to FIG. 3). A value of '0' for the byte indicator may indicate that the associated memory die is coupled with a lower DQ channel and a value of '1' may indicate that the associated memory die is coupled with an upper DQ channel (e.g., as illustrated by, and described with reference to, FIG. 3). The link indicator may indicate whether the corresponding memory die is linked directly with the DQ channel or is linked indirectly with the DQ channel (e.g., via the directly linked die). For example, a value of '0' for the link indicator may indicate that the associated memory die is linked indirectly to the DQ channel (e.g., is an interface die) and a value of '1' for the link indicator may indicate that the associated memory die is linked directly to the DQ channel (e.g., a linked die).

As such, a value of '00' for the memory die ID may identify the associated memory die as a die coupled with the lower byte DQ channel, as an indirectly linked die (e.g., die 0). A value of '01' for the memory die ID may identify the memory die as being coupled with the lower byte DQ channel and as being directly linked (e.g., die 1), while a value of '10' may identify the memory die as being coupled with the upper byte DQ channel and as being indirectly linked to that channel (e.g., die 0). Similarly, a value of '11' for the memory die ID may identify the memory die as being coupled with the upper byte DQ channel and as being directly linked to that channel (e.g., die 1).

Each register 605-*a* may further indicate a status of the corresponding memory die, such that the memory device may access the respective register (e.g., via a register read operation) to determine whether a respective memory die is enabled or disabled for the select die access mode. For example, each register 605-*a* may store or indicate a third bit (e.g., OP[2]) which may represent the status or mode of the memory die for the select die access mode (e.g., a enabled or disabled mode), which may be referred to as a select indicator. For example, if the select indicator is set to a value of '0' (e.g., by a register write operation, in response to a received select die access command), the associated memory die may be masked or disabled from the select die access mode. If the select indicator is set to a value of '1' (e.g., which may be referred to as a default mode), the associated memory die may be enabled in the select die access mode.

The bits or locations of the register 605-*a* (e.g., indicating the memory die ID and the status of the select die access mode for the memory die) may be read-only bits. For example, once the memory device is fabricated, the bits representative of the memory die ID may be configured by an on die circuit or by blowing one or more manufacture fuses. The status of the memory die may be changed by a select die command in response to operating in the select die access mode, as described herein, and may not be changed in response to any other command. This bit may have a value of '1' outside of the select die access mode (e.g., which may be the default value, because the memory dies may be enabled to receive commands).

As described herein, the memory device, in some cases, may perform a register read operation for one or more respective registers to determine a status for the select die access mode for the corresponding memory die(s). The memory device may mask or disable at least a subset of commands for any disabled memory dies, for example, based on the status (e.g., enabled or disabled) of each respective memory die. Similarly, the memory device may unmask or enable commands for any enabled memory dies.

In some cases, the memory device may include one register 605-*b* (e.g., a mode register 21 (MR21)), which may indicate a status or mode of the select die access mode (e.g., for the memory device). The register 605-*b* may indicate a level of the select die access mode using one or more bits stored at the register 605-*b*. For example, the register may use two bits (e.g., or more bits) to identify one of four levels (e.g., or any quantity of levels), where each combination of the two bits may identify a corresponding level. Thus, a value of '00' may identify a first level (e.g., Level 0), a value of '01' may identify a second level (e.g., Level 1), and so forth. In some cases, if the memory device is configured with two levels for the select die access mode, additional bit values of '10' and '11' may be reserved.

The level of the select die access mode may be indicated by a host device, such as in response to enabling the select die access mode, or may be determined by the memory device (e.g., based on entering a test mode or a repair mode). Such determinations are further described herein with reference to FIG. 5.

The register 605-*b* may also indicate whether the select die access mode is enabled or disabled for the memory device, for example, using a third bit (e.g., OP[0]). For example, if the third bit is set to a value of '0' (e.g., in response to a register write command received from the host device), the select die access mode may be disabled (e.g., which may represent a default mode). If the third bit is set to a value of '1 (e.g., in response to a register write), the select die access mode may be enabled.

The bits or locations of the register 605-*b* indicating the status of the select die access mode) may be read/write bits. For example, in response to the select die access mode being entered or enabled (e.g., by a register write command), the value of the third bit may be set to '1,' indicating that the select die access mode is enabled. Upon clearing or exiting the select die access mode (e.g., in response to a second register write command), the value of the third bit may be set to '0,' indicating that the select die access mode is disabled. In such cases, each command received via the shared CA channel may be performed by each memory die coupled with the CA channel.

The bits or locations of the register 605-*b* indicating the select die access level may be read-only bits. For example, these bits may be changed by one or more defined sequences, as described with reference to FIG. 5. Entering the select die access mode, and entering a higher level of the select die access mode, may protect a user of the host device and memory device, for example, by providing a sequence of multiple keys that may prevent the user from accidentally entering the select die access mode, or a higher level of the select die access mode.

In response to the select die access mode being enabled, as described herein, a select die access command may be received by the memory device, which may support enabling or disabling one or more memory dies for the select die access mode. While in the select die access mode, the enabled memory die(s) may perform any command, while the disabled memory die(s) may refrain (e.g., or be restricted) from performing one or more commands that belong to a subset of commands (e.g., as described with reference to FIG. 5). After exiting the select die access mode, each of the memory dies may perform any received command, as described herein.

Figure 7:
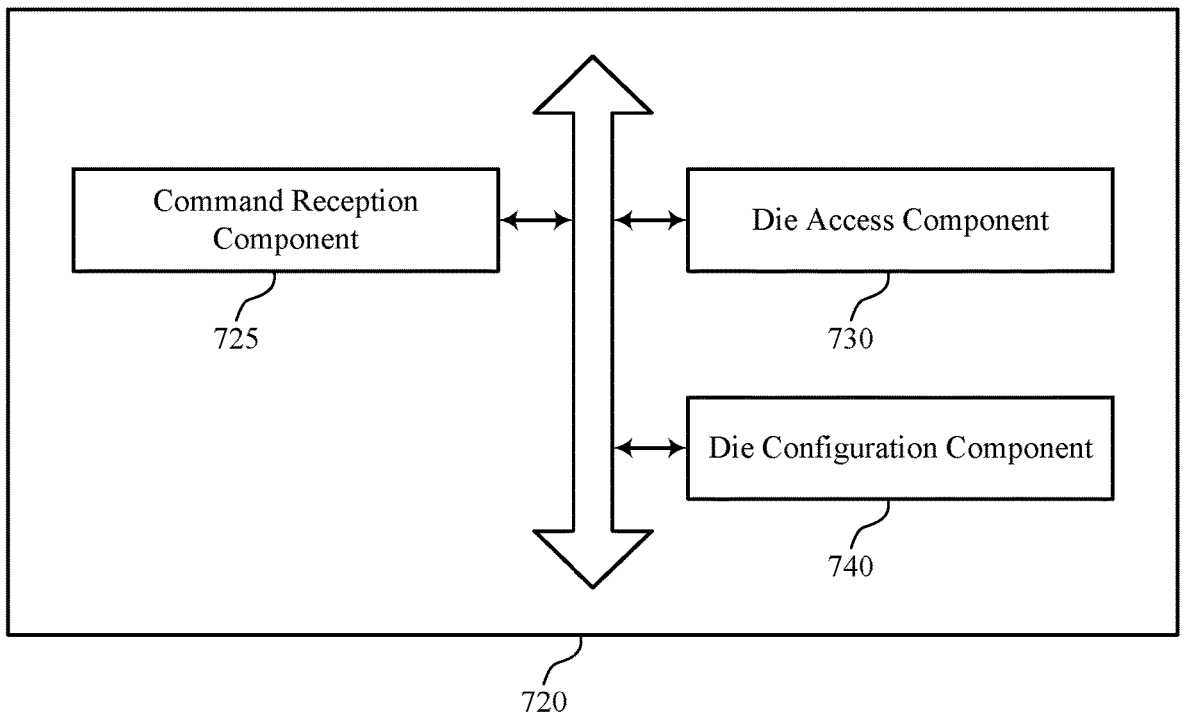
FIG. 7 shows a block diagram of a memory device that supports selective access for grouped memory dies in accordance with examples as disclosed herein.

FIG. 7 shows a block diagram 700 of a memory device 720 that supports selective access for grouped memory dies in accordance with examples as disclosed herein. The memory device 720 may be an example of aspects of a memory device as described with reference to FIGS. 1 through 6. The memory device 720, or various components thereof, may be an example of means for performing various aspects of selective access for grouped memory dies as described herein. For example, the memory device 720 may include a command reception component 725, a die access component 730, a die configuration component 740, or any combination thereof. Each of these components may communicate, directly or indirectly, with one another (e.g., via one or more buses).

The command reception component 725 may be configured as or otherwise support a means for receiving, at a memory device and over a CA channel coupled with each of a set of multiple memory dies, a first command enabling a set of commands for a first memory die of the set and disabling a first subset of the set of commands for a second memory die of the set, where each of the memory dies is operable by a same command received over the CA channel. In some examples, the command reception component 725 may be configured as or otherwise support a means for receiving, over the CA channel, a second command indicating one or more operations to perform for the set of multiple memory dies, the first subset of commands including the second command. The die access component 730 may be configured as or otherwise support a means for performing the one or more operations for the first memory die in response to the second command.

In some examples, the die access component 730 may be configured as or otherwise support a means for restricting the second memory die from performing the one or more operations in response to the second command.

In some examples, the die configuration component 740 may be configured as or otherwise support a means for configuring the first memory die to operate in a first mode based on the first command, where configuring the first mode includes enabling the set of commands for the first memory die. In some examples, the die configuration component 740 may be configured as or otherwise support a means for configuring the second memory die to operate in a second mode based on the first command, where configuring the second mode includes disabling the first subset of commands and enabling a second subset of the set of commands for the second memory die.

In some examples, the die configuration component 740 may be configured as or otherwise support a means for configuring the second memory die to operate in a third mode based on the first command, where configuring the third mode includes disabling a third subset of commands of the set of commands and enabling a fourth subset of commands of the set of commands for the second memory die, where the third subset of commands is different than the first subset of commands and the fourth subset of commands is different than the second subset of commands. In some examples, the die configuration component 740 may be configured as or otherwise support a means for configuring the second memory die to operate in the third mode based on entering a repair mode or a test mode for the set of multiple memory dies. In some examples, the second mode includes a first level of a select die access protocol. In some examples, the third mode includes a second level of the select die access protocol.

In some examples, the die configuration component 740 may be configured as or otherwise support a means for storing, at a first register associated with the first memory die, an identifier of the first memory die and an indication of whether the first memory die is configured to operate in the first mode or the second mode. In some examples, the die configuration component 740 may be configured as or otherwise support a means for storing, at a second register associated with the second memory die, an identifier of the second memory die and an indication of whether the second memory die is configured to operate in the first mode or the second mode.

In some examples, the die configuration component 740 may be configured as or otherwise support a means for storing, at a register of the memory device, an indication of a level associated with the second mode and an indication of whether the first mode and the second mode are enabled. In some examples, the first command includes an MPC command that is associated with synchronization and calibration operations of the set of multiple memory dies. In some examples, the first command includes a command that is associated with enabling and disabling commands received via the CA channel for the set of multiple memory dies. In some examples, the one or more operations include a write operation to a register of the memory device that is associated with the first memory die, a repair operation for the first memory die, or both.

In some examples, the set of multiple memory dies is coupled with a host device and is accessible by a peripheral device coupled with the host device via an interface configured for a CXL protocol. In some examples, the set of multiple memory dies is coupled with the peripheral device and is accessible by the host device via the interface.

Figure 8:
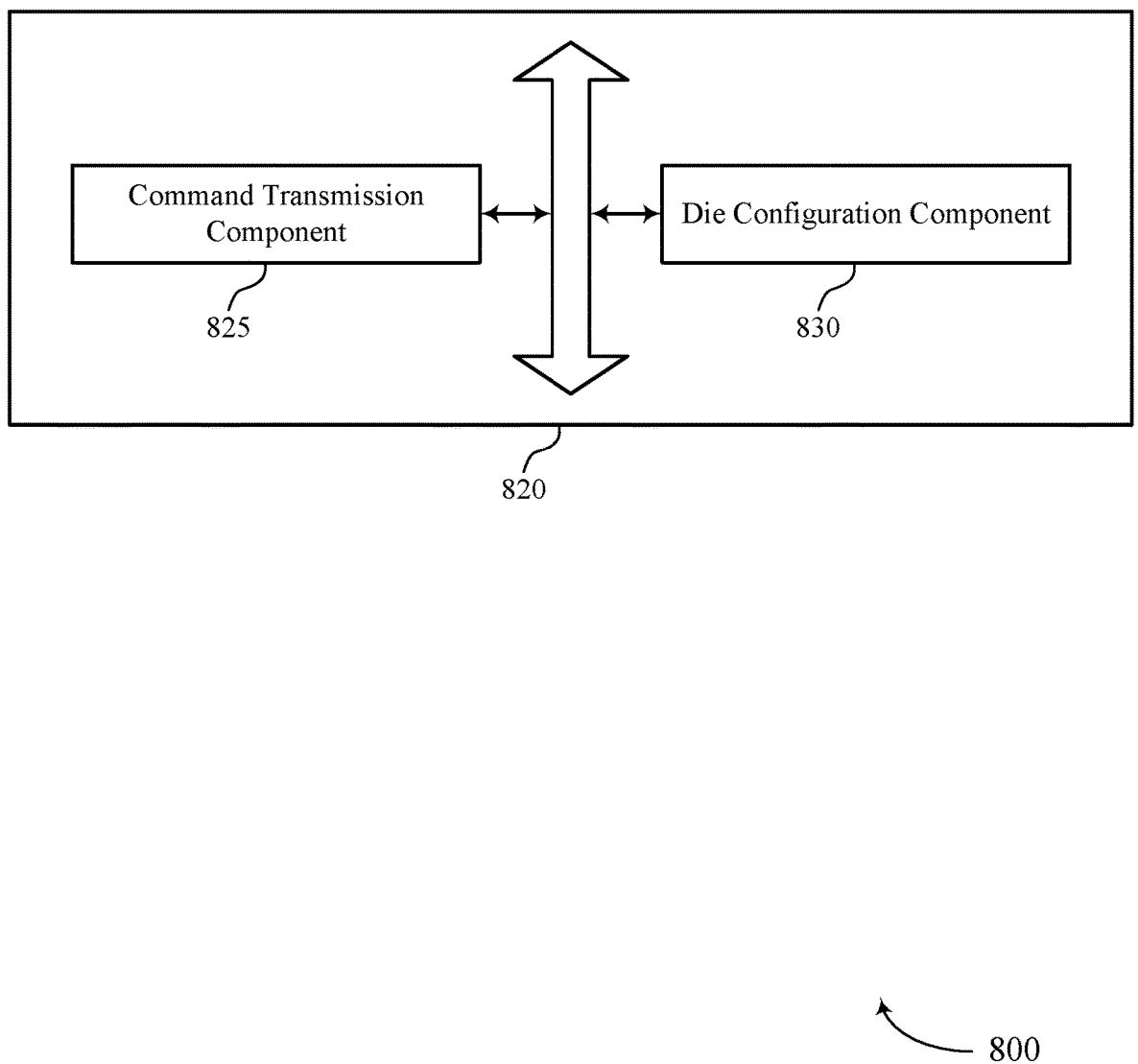
FIG. 8 shows a block diagram of a host device that supports selective access for grouped memory dies in accordance with examples as disclosed herein.

FIG. 8 shows a block diagram 800 of a host device 820 that supports selective access for grouped memory dies in accordance with examples as disclosed herein. The host device 820 may be an example of aspects of a host device as described with reference to FIGS. 1 through 6. The host device 820, or various components thereof, may be an example of means for performing various aspects of selective access for grouped memory dies as described herein. For example, the host device 820 may include a command transmission component 825 a die configuration component 830, or any combination thereof. Each of these components may communicate, directly or indirectly, with one another (e.g., via one or more buses).

The command transmission component 825 may be configured as or otherwise support a means for transmitting, over a CA channel coupled with each of a set of multiple memory dies, a first command enabling a set of commands for a first memory die of the set and disabling a first subset of the set of commands for a second memory die of the set. In some examples, the command transmission component 825 may be configured as or otherwise support a means for transmitting, over the CA channel, a second command indicating one or more operations to perform for the set of multiple memory dies, the first subset of commands including the second command.

In some examples, the first command further indicates for the first memory die to operate in a first mode in which the set of commands is enabled and indicates for the second memory die to operate in a second mode in which the first subset of commands is disabled and a second subset of the set of commands is enabled.

In some examples, the die configuration component 830 may be configured as or otherwise support a means for configuring the second memory die to operate in a third mode based on the first command, where configuring the third mode includes disabling a third subset of commands of the set of commands and enabling a fourth subset of commands of the set of commands for the second memory die, where the third subset of commands is different than the first subset of commands and the fourth subset of commands is different than the second subset of commands. In some examples, the die configuration component 830 may be configured as or otherwise support a means for configuring the second memory die to operate in the third mode based on entering a repair mode or a test mode for the set of multiple memory dies. In some examples, the second mode includes a first level of a select die access protocol. In some examples, the third mode includes a second level of the select die access protocol.

In some examples, the first command includes an MPC command that is associated with synchronization and calibration operations for the set of multiple memory dies. In some examples, the first command includes a command that is associated with enabling and disabling commands received via the CA channel for the set of multiple memory dies.

Figure 9:
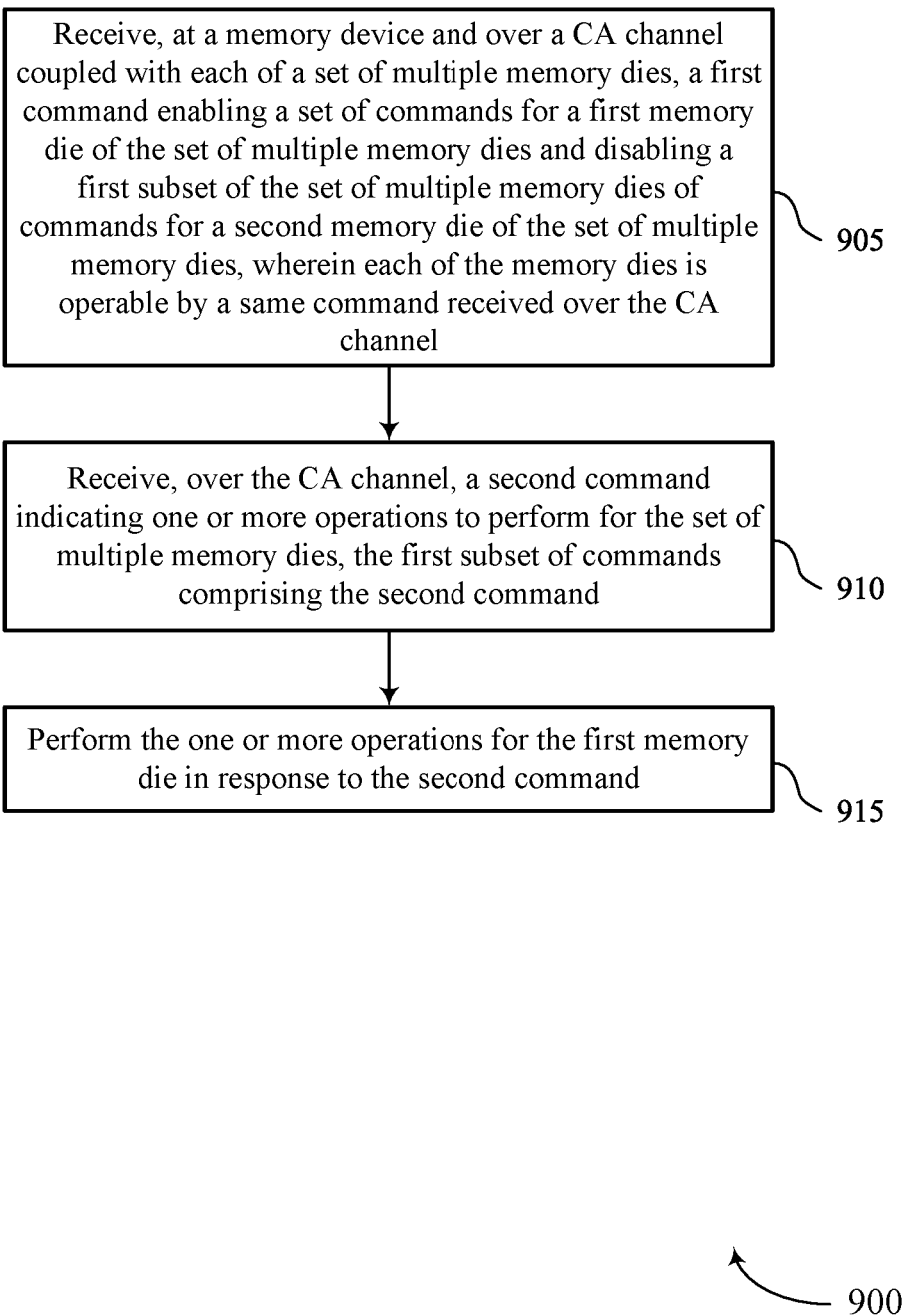
FIGS. 9 and 10 show flowcharts illustrating a method or methods that support selective access for grouped memory dies in accordance with examples as disclosed herein.

FIG. 9 shows a flowchart illustrating a method 900 that supports selective access for grouped memory dies in accordance with examples as disclosed herein. The operations of method 900 may be implemented by a memory device or its components as described herein. For example, the operations of method 900 may be performed by a memory device as described with reference to FIGS. 1 through 7. In some examples, a memory device may execute a set of instructions to control the functional elements of the device to perform the described functions. Additionally or alternatively, the memory device may perform aspects of the described functions using special-purpose hardware.

At 905, the method may include receiving, at a memory device and over a CA channel coupled with each of a set of multiple memory dies, a first command enabling a set of commands for a first memory die of the set and disabling a first subset of the set of commands for a second memory die of the set, where each of the memory dies is operable by a same command received over the CA channel. The operations of 905 may be performed in accordance with examples as described with reference to FIG. 3-6. In some examples, aspects of the operations of 905 may be performed by a command reception component 725 as described with reference to FIG. 7.

At 910, the method may include receiving, over the CA channel, a second command indicating one or more operations to perform for the set of multiple memory dies, the first subset of commands including the second command. The operations of 910 may be performed in accordance with examples as described with reference to FIG. 3-6. In some examples, aspects of the operations of 910 may be performed by a command reception component 725 as described with reference to FIG. 7.

At 915, the method may include performing the one or more operations for the first memory die in response to the second command. The operations of 915 may be performed in accordance with examples as described with reference to FIG. 3-6. In some examples, aspects of the operations of 915 may be performed by a die access component 730 as described with reference to FIG. 7.

In some examples, an apparatus as described herein may perform a method or methods, such as the method 900. The apparatus may include, features, circuitry, logic, means, or instructions (e.g., a non-transitory computer-readable medium storing instructions executable by a processor) for receiving, at a memory device and over a CA channel coupled with each of a set of multiple memory dies, a first command enabling a set of commands for a first memory die of the set and disabling a first subset of the set of commands for a second memory die of the set, where each of the memory dies is operable by a same command received over the CA channel, receiving, over the CA channel, a second command indicating one or more operations to perform for the set of multiple memory dies, the first subset of commands including the second command, and performing the one or more operations for the first memory die in response to the second command.

Some examples of the method 900 and the apparatus described herein may further include operations, features, circuitry, logic, means, or instructions for restricting the second memory die from performing the one or more operations in response to the second command.

Some examples of the method 900 and the apparatus described herein may further include operations, features, circuitry, logic, means, or instructions for configuring the first memory die to operate in a first mode based on the first command, where configuring the first mode includes enabling the set of commands for the first memory die and configuring the second memory die to operate in a second mode based on the first command, where configuring the second mode includes disabling the first subset of commands and enabling a second subset of the set of commands for the second memory die.

Some examples of the method 900 and the apparatus described herein may further include operations, features, circuitry, logic, means, or instructions for configuring the second memory die to operate in a third mode based on the first command, where configuring the third mode includes disabling a third subset of commands of the set of commands and enabling a fourth subset of commands of the set of commands for the second memory die, where the third subset of commands may be different than the first subset of commands and the fourth subset of commands may be different than the second subset of commands.

In some examples of the method 900 and the apparatus described herein, the second mode includes a first level of a select die access protocol and the third mode includes a second level of the select die access protocol.

Some examples of the method 900 and the apparatus described herein may further include operations, features, circuitry, logic, means, or instructions for configuring the second memory die to operate in the third mode based on entering a repair mode or a test mode for the set of multiple memory dies.

Some examples of the method 900 and the apparatus described herein may further include operations, features, circuitry, logic, means, or instructions for storing, at a first register associated with the first memory die, an identifier of the first memory die and an indication of whether the first memory die may be configured to operate in the first mode or the second mode and storing, at a second register associated with the second memory die, an identifier of the second memory die and an indication of whether the second memory die may be configured to operate in the first mode or the second mode.

Some examples of the method 900 and the apparatus described herein may further include operations, features, circuitry, logic, means, or instructions for storing, at a register of the memory device, an indication of a level associated with the second mode and an indication of whether the first mode and the second mode may be enabled.

In some examples of the method 900 and the apparatus described herein, the first command includes an MPC command that may be associated with synchronization and calibration operations of the set of multiple memory dies.

In some examples of the method 900 and the apparatus described herein, the first command includes a command that may be associated with enabling and disabling commands received via the CA channel for the set of multiple memory dies.

In some examples of the method 900 and the apparatus described herein, the one or more operations include a write operation to a register of the memory device that may be associated with the first memory die, a repair operation for the first memory die, or both.

In some examples of the method 900 and the apparatus described herein, the set of multiple memory dies may be coupled with a host device and may be accessible by a peripheral device coupled with the host device via an interface configured for a CXL protocol and the set of multiple memory dies may be coupled with the peripheral device and may be accessible by the host device via the interface.

Figure 10:
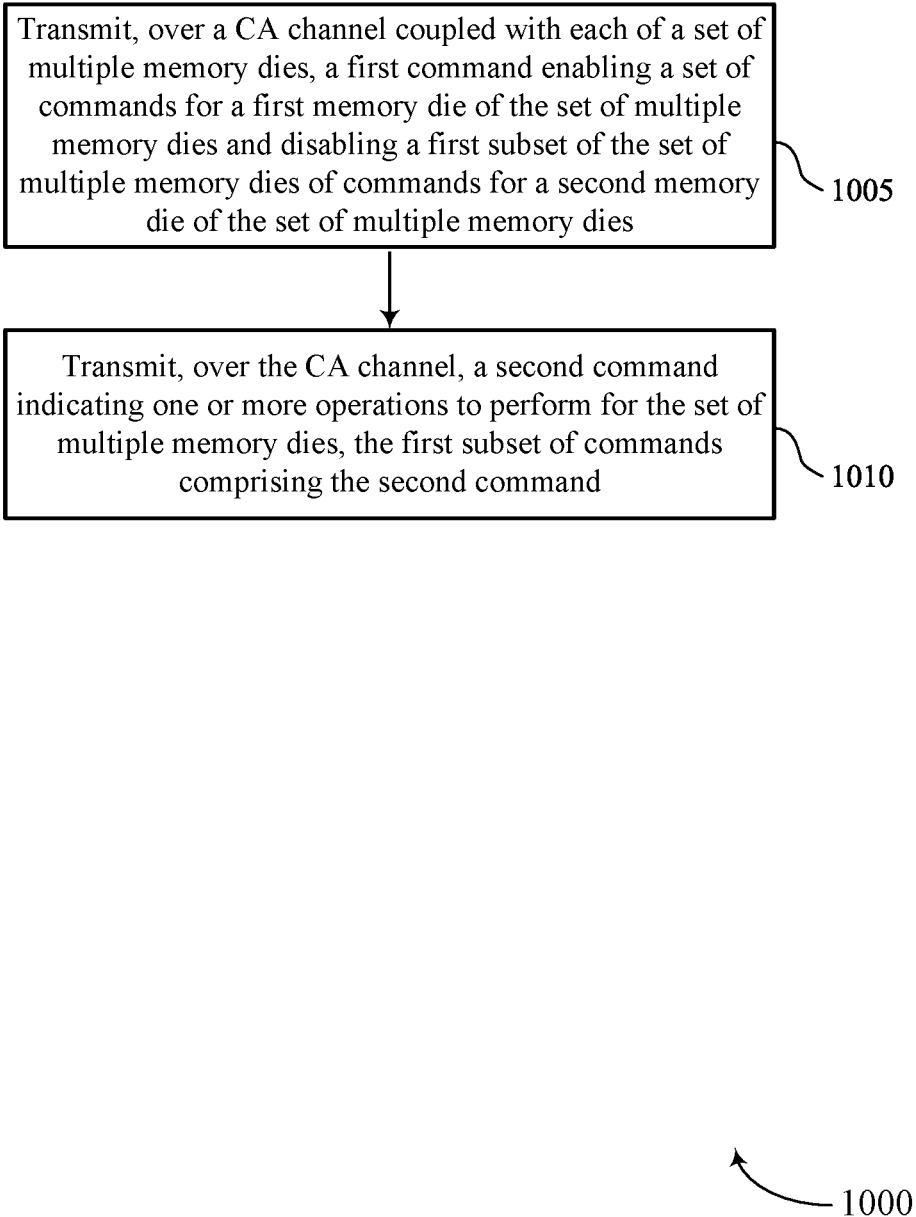

FIG. 10 shows a flowchart illustrating a method 1000 that supports selective access for grouped memory dies in accordance with examples as disclosed herein. The operations of method 1000 may be implemented by a host device or its components as described herein. For example, the operations of method 1000 may be performed by a host device as described with reference to FIGS. 1 through 6 and 8. In some examples, a host device may execute a set of instructions to control the functional elements of the device to perform the described functions. Additionally or alternatively, the host device may perform aspects of the described functions using special-purpose hardware.

At 1005, the method may include transmitting, over a CA channel coupled with each of a set of multiple memory dies, a first command enabling a set of commands for a first memory die of the set and disabling a first subset of the set of commands for a second memory die of the set. The operations of 1005 may be performed in accordance with examples as described with reference to FIG. 3-6. In some examples, aspects of the operations of 1005 may be performed by a command transmission component 825 as described with reference to FIG. 8.

At 1010, the method may include transmitting, over the CA channel, a second command indicating one or more operations to perform for the set of multiple memory dies, the first subset of commands including the second command. The operations of 1010 may be performed in accordance with examples as described with reference to FIG. 3-6. In some examples, aspects of the operations of 1010 may be performed by a command transmission component 825 as described with reference to FIG. 8.

In some examples, an apparatus as described herein may perform a method or methods, such as the method 1000. The apparatus may include, features, circuitry, logic, means, or instructions (e.g., a non-transitory computer-readable medium storing instructions executable by a processor) for transmitting, over a CA channel coupled with each of a set of multiple memory dies, a first command enabling a set of commands for a first memory die of the set and disabling a first subset of the set of commands for a second memory die of the set and transmitting, over the CA channel, a second command indicating one or more operations to perform for the set of multiple memory dies, the first subset of commands including the second command.

In some examples of the method 1000 and the apparatus described herein, the first command further indicates for the first memory die to operate in a first mode in which the set of commands may be enabled and indicates for the second memory die to operate in a second mode in which the first subset of commands may be disabled and a second subset of the set of commands may be enabled.

Some examples of the method 1000 and the apparatus described herein may further include operations, features, circuitry, logic, means, or instructions for configuring the second memory die to operate in a third mode based on the first command, where configuring the third mode includes disabling a third subset of commands of the set of commands and enabling a fourth subset of commands of the set of commands for the second memory die, where the third subset of commands may be different than the first subset of commands and the fourth subset of commands may be different than the second subset of commands.

In some examples of the method 1000 and the apparatus described herein, the second mode includes a first level of a select die access protocol and the third mode includes a second level of the select die access protocol.

Some examples of the method 1000 and the apparatus described herein may further include operations, features, circuitry, logic, means, or instructions for configuring the second memory die to operate in the third mode based on entering a repair mode or a test mode for the set of multiple memory dies.

In some examples of the method 1000 and the apparatus described herein, the first command includes an MPC command that may be associated with synchronization and calibration operations for the set of multiple memory dies.

In some examples of the method 1000 and the apparatus described herein, the first command includes a command that may be associated with enabling and disabling commands received via the CA channel for the set of multiple memory dies.

It should be noted that the methods described herein describe possible implementations, and that the operations and the steps may be rearranged or otherwise modified and that other implementations are possible. Further, portions from two or more of the methods may be combined.

An apparatus is described. The apparatus may include a set of multiple memory dies, a CA channel coupled with each memory die of the set, where each of the memory dies is operable by a same command received over the CA channel, and circuitry coupled with the set of multiple memory dies and the CA channel and operable to receive, over the CA channel, a first command enabling a set of commands for a first memory die of the set and disabling a first subset of the set of commands for a second memory die of the set, receive, over the CA channel, a second command indicating one or more operations to perform for the set of multiple memory dies, the first subset of commands including the second command, and perform the one or more operations for the first memory die in response to the second command.

In some examples, the circuitry may be further operable to restrict the second memory die from performing the one or more operations in response to the second command. In some examples, the circuitry may be further operable to configure the second memory die to operate in a third mode based on the first command, where configuring the third mode includes disabling a third subset of commands of the set of commands and enabling a fourth subset of commands of the set of commands for the second memory die, where the third subset of commands may be different than the first subset of commands and the fourth subset of commands may be different than the second subset of commands.

In some examples of the apparatus, the second mode includes a first level of a select die access protocol and the third mode includes a second level of the select die access protocol. In some examples of the apparatus, the circuitry may be further operable to configure the second memory die to operate in the third mode based on entering a repair mode or a test mode for the set of multiple memory dies.

In some examples, the circuitry may be further operable to configure the first memory die to operate in a first mode based on the first command, where configuring the first mode includes enabling the set of commands for the first memory die, and configure the second memory die to operate in a second mode based on the first command, where configuring the second mode includes disabling the first subset of commands and enabling a second subset of the set of commands for the second memory die.

In some examples, the apparatus may include a first register associated with the first memory die and operable to store an ID of the first memory die and an indication of whether the first memory die may be configured to operate in the first mode or the second mode and a second register associated with the second memory die and operable to store an ID of the second memory die and an indication of whether the second memory die may be configured to operate in the first mode or the second mode. In some examples, the apparatus may include a register operable to store an indication of a level associated with the second mode and an indication of whether the first mode and the second mode may be enabled.

In some examples of the apparatus, the first command includes an MPC command that may be associated with synchronization and calibration operations of the set of multiple memory dies. In some examples of the apparatus, the first command includes a command that may be associated with enabling and disabling commands received via the CA channel for the set of multiple memory dies.

In some examples of the apparatus, the one or more operations include a write operation to a register of the apparatus that may be associated with the first memory die, a repair operation for the first memory die, or both. In some examples of the apparatus, the set of multiple memory dies may be coupled with a host device and may be accessible by a peripheral device coupled with the host device via an interface configured for a CXL protocol and the set of multiple memory dies may be coupled with the peripheral device and may be accessible by the host device via the interface.

Another apparatus is described. The apparatus may include circuitry operable to transmit, over a CA channel, a first command enabling a set of commands for a first memory die of a set of multiple memory dies each coupled with the CA channel and disabling a first subset of the set of commands for a second memory die of the set and transmit, over the CA channel, a second command indicating one or more operations to perform for the set of multiple memory dies, the first subset of commands including the second command.

In some examples of the apparatus, the first command further indicates for the first memory die to operate in a first mode in which the set of commands may be enabled and indicates for the second memory die to operate in a second mode in which the first subset of commands may be disabled and a second subset of the set of commands may be enabled.

In some examples, the circuitry may be further operable to configure the second memory die to operate in a third mode based on the first command, where configuring the third mode includes disabling a third subset of commands of the set of commands and enabling a fourth subset of commands of the set of commands for the second memory die, where the third subset of commands may be different than the first subset of commands and the fourth subset of commands may be different than the second subset of commands. In some examples of the apparatus, the second mode includes a first level of a select die access protocol and the third mode includes a second level of the select die access protocol. In some examples, the circuitry may be further operable to configure the second memory die to operate in the third mode based on entering a repair mode or a test mode for the set of multiple memory dies.

In some examples of the apparatus, the first command includes an MPC command that may be associated with synchronization and calibration operations for the set of multiple memory dies. In some examples of the apparatus, the first command includes a command that may be associated with enabling and disabling commands received via the CA channel for the set of multiple memory dies.

In some examples of the apparatus, the one or more operations include a write operation to a register associated with the first memory die, a repair operation for the first memory die, or both. In some examples of the apparatus, the set of multiple memory dies may be coupled with the apparatus and may be accessible by a peripheral device coupled with the apparatus via an interface configured for a CXL protocol and the set of multiple memory dies may be coupled with the peripheral device and may be accessible by the apparatus via the interface.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a plurality of memory dies;
   a command/address channel coupled with each memory die of the plurality, wherein each of the memory dies is operable by a same command received over the command/address channel; and
   circuitry coupled with the plurality of memory dies and the command/address channel and operable to:
   receive, over the command/address channel, a first command enabling a set of commands for a first memory die of the plurality and disabling a first subset of the set of commands for a second memory die of the plurality;
   receive, over the command/address channel, a second command indicating one or more operations to perform for the plurality of memory dies, the first subset of commands comprising the second command; and
   perform the one or more operations for the first memory die in response to the second command.

2. The apparatus of claim 1, wherein the circuitry is further operable to:
   restrict the second memory die from performing the one or more operations in response to the second command.

3. The apparatus of claim 1, wherein the circuitry is further operable to:
   configure the first memory die to operate in a first mode based at least in part on the first command, wherein configuring the first mode comprises enabling the set of commands for the first memory die; and
   configure the second memory die to operate in a second mode based at least in part on the first command, wherein configuring the second mode comprises disabling the first subset of commands and enabling a second subset of the set of commands for the second memory die.

4. The apparatus of claim 3, wherein the circuitry is further operable to:
   configure the second memory die to operate in a third mode based at least in part on the first command, wherein configuring the third mode comprises disabling a third subset of commands of the set of commands and enabling a fourth subset of commands of the set of commands for the second memory die, wherein the third subset of commands is different than the first subset of commands and the fourth subset of commands is different than the second subset of commands.

5. The apparatus of claim 4, wherein:
the second mode comprises a first level of a select die access protocol; and
the third mode comprises a second level of the select die access protocol.

6. The apparatus of claim 4, wherein the circuitry is further operable to:
configures the second memory die to operate in the third mode based at least in part on entering a repair mode or a test mode for the plurality of memory dies.

7. The apparatus of claim 3, further comprising:
a first register associated with the first memory die and operable to store an identifier of the first memory die and an indication of whether the first memory die is configured to operate in the first mode or the second mode; and
a second register associated with the second memory die and operable to store an identifier of the second memory die and an indication of whether the second memory die is configured to operate in the first mode or the second mode.

8. The apparatus of claim 3, further comprising:
a register operable to store an indication of a level associated with the second mode and an indication of whether the first mode and the second mode are enabled.

9. The apparatus of claim 1, wherein the first command comprises a multipurpose (MPC) command that is associated with synchronization and calibration operations of the plurality of memory dies.

10. The apparatus of claim 1, wherein the first command comprises a command that is associated with enabling and disabling commands received via the command/address channel for the plurality of memory dies.

11. The apparatus of claim 1, wherein the one or more operations comprise a write operation to a register of the apparatus that is associated with the first memory die, a repair operation for the first memory die, or both.

12. The apparatus of claim 1, wherein:
the plurality of memory dies is coupled with a host device and is accessible by a peripheral device coupled with the host device via an interface configured for a Compute Express Link (CXL) protocol; or
the plurality of memory dies is coupled with the peripheral device and is accessible by the host device via the interface.

13. An apparatus, comprising:
circuitry operable to:
transmit, over a command/address channel, a first command enabling a set of commands for a first memory die of a plurality of memory dies each coupled with the command/address channel and disabling a first subset of the set of commands for a second memory die of the plurality; and
transmit, over the command/address channel, a second command indicating one or more operations to perform for the plurality of memory dies, the first subset of commands comprising the second command.

14. The apparatus of claim 13, wherein the first command further indicates for the first memory die to operate in a first mode in which the set of commands is enabled and indicates for the second memory die to operate in a second mode in which the first subset of commands is disabled and a second subset of the set of commands is enabled.

15. The apparatus of claim 14, wherein the circuitry is further operable to:
configure the second memory die to operate in a third mode based at least in part on the first command, wherein configuring the third mode comprises disabling a third subset of commands of the set of commands and enabling a fourth subset of commands of the set of commands for the second memory die, wherein the third subset of commands is different than the first subset of commands and the fourth subset of commands is different than the second subset of commands.

16. The apparatus of claim 15, wherein:
the second mode comprises a first level of a select die access protocol; and
the third mode comprises a second level of the select die access protocol.

17. The apparatus of claim 15, wherein the circuitry is further operable to:
configure the second memory die to operate in the third mode based at least in part on entering a repair mode or a test mode for the plurality of memory dies.

18. The apparatus of claim 13, wherein the first command comprises a multipurpose (MPC) command that is associated with synchronization and calibration operations for the plurality of memory dies.

19. The apparatus of claim 13, wherein the first command comprises a command that is associated with enabling and disabling commands received via the command/address channel for the plurality of memory dies.

20. The apparatus of claim 13, wherein the one or more operations comprise a write operation to a register associated with the first memory die, a repair operation for the first memory die, or both.

21. The apparatus of claim 13, wherein:
the plurality of memory dies is coupled with the apparatus and is accessible by a peripheral device coupled with the apparatus via an interface configured for a Compute Express Link (CXL) protocol; or
the plurality of memory dies is coupled with the peripheral device and is accessible by the apparatus via the interface.

22. A method, comprising:
receiving, at a memory device and over a command/address channel coupled with each of a plurality of memory dies, a first command enabling a set of commands for a first memory die of the plurality and disabling a first subset of the set of commands for a second memory die of the plurality, wherein each of the memory dies is operable by a same command received over the command/address channel;
receiving, over the command/address channel, a second command indicating one or more operations to perform for the plurality of memory dies, the first subset of commands comprising the second command; and
performing the one or more operations for the first memory die in response to the second command.

23. The method of claim 22, further comprising:
restricting the second memory die from performing the one or more operations in response to the second command.

24. The method of claim 22, further comprising:
configuring the first memory die to operate in a first mode based at least in part on the first command, wherein configuring the first mode comprises enabling the set of commands for the first memory die; and configuring the second memory die to operate in a second mode based at least in part on the first command, wherein configuring the second mode comprises disabling the first subset of commands and enabling a second subset of the set of commands for the second memory die.

25. The method of claim 24, further comprising:
configuring the second memory die to operate in a third mode based at least in part on the first command, wherein configuring the third mode comprises disabling a third subset of commands of the set of commands and enabling a fourth subset of commands of the set of commands for the second memory die, wherein the third subset of commands is different than the first subset of commands and the fourth subset of commands is different than the second subset of commands.

26. The method of claim 25, wherein:
the second mode comprises a first level of a select die access protocol; and
the third mode comprises a second level of the select die access protocol.

27. The method of claim 25, further comprising:
configuring the second memory die to operate in the third mode based at least in part on entering a repair mode or a test mode for the plurality of memory dies.

28. The method of claim 24, further comprising:
storing, at a first register associated with the first memory die, an identifier of the first memory die and an indication of whether the first memory die is configured to operate in the first mode or the second mode; and
storing, at a second register associated with the second memory die, an identifier of the second memory die and an indication of whether the second memory die is configured to operate in the first mode or the second mode.

29. The method of claim 24, further comprising:
storing, at a register of the memory device, an indication of a level associated with the second mode and an indication of whether the first mode and the second mode are enabled.

30. The method of claim 22, wherein the first command comprises a multipurpose (MPC) command that is associated with synchronization and calibration operations of the plurality of memory dies.

31. The method of claim 22, wherein the first command comprises a command that is associated with enabling and disabling commands received via the command/address channel for the plurality of memory dies.

32. The method of claim 22, wherein the one or more operations comprise a write operation to a register of the memory device that is associated with the first memory die, a repair operation for the first memory die, or both.

33. The method of claim 22, wherein:
the plurality of memory dies is coupled with a host device and is accessible by a peripheral device coupled with the host device via an interface configured for a Compute Express Link (CXL) protocol; or
the plurality of memory dies is coupled with the peripheral device and is accessible by the host device via the interface.

34. A method, comprising:
transmitting, over a command/address channel coupled with each of a plurality of memory dies, a first command enabling a set of commands for a first memory die of the plurality and disabling a first subset of the set of commands for a second memory die of the plurality; and
transmitting, over the command/address channel, a second command indicating one or more operations to perform for the plurality of memory dies, the first subset of commands comprising the second command.

35. The method of claim 34, wherein the first command further indicates for the first memory die to operate in a first mode in which the set of commands is enabled and indicates for the second memory die to operate in a second mode in which the first subset of commands is disabled and a second subset of the set of commands is enabled.

36. The method of claim 35, further comprising:
configuring the second memory die to operate in a third mode based at least in part on the first command, wherein configuring the third mode comprises disabling a third subset of commands of the set of commands and enabling a fourth subset of commands of the set of commands for the second memory die, wherein the third subset of commands is different than the first subset of commands and the fourth subset of commands is different than the second subset of commands.

37. The method of claim 36, wherein:
the second mode comprises a first level of a select die access protocol; and
the third mode comprises a second level of the select die access protocol.

38. The method of claim 36, further comprising:
configuring the second memory die to operate in the third mode based at least in part on entering a repair mode or a test mode for the plurality of memory dies.

39. The method of claim 34, wherein the first command comprises a multipurpose (MPC) command that is associated with synchronization and calibration operations for the plurality of memory dies.

40. The method of claim 34, wherein the first command comprises a command that is associated with enabling and disabling commands received via the command/address channel for the plurality of memory dies.

41. A non-transitory computer-readable medium storing code comprising instructions which, when executed by a processor of an electronic device, cause the electronic device to:
receive, via a command/address channel coupled with each of a plurality of memory dies, a first command enabling a set of commands for a first memory die of the plurality and disabling a first subset of the set of commands for a second memory die of the plurality, wherein each of the memory dies is operable by a same command received over the command/address channel;
receive a second command via the command/address channel indicating one or more operations to perform for the plurality of memory dies, the first subset of commands comprising the second command; and
perform the one or more operations for the first memory die in response to the second command.

* * * * *